United States Patent
Louvar et al.

(10) Patent No.: US 9,807,908 B2
(45) Date of Patent: Oct. 31, 2017

(54) PUMPED LIQUID COOLING SYSTEM USING A PHASE CHANGE FLUID WITH ADDITIONAL SUBAMBIENT COOLING

(75) Inventors: Timothy Louvar, Fort Wayne, IN (US); Brandon Wegmann, Fort Wayne, IN (US); Abhijit Sathe, Mahape (IN)

(73) Assignee: Parker-Hannifin Corporation, Cleveland, OH (US)

( * ) Notice: Subject to any disclaimer, the term of this patent is extended or adjusted under 35 U.S.C. 154(b) by 185 days.

(21) Appl. No.: 14/130,019

(22) PCT Filed: Jul. 2, 2012

(86) PCT No.: PCT/US2012/045301
§ 371 (c)(1),
(2), (4) Date: Dec. 30, 2013

(87) PCT Pub. No.: WO2013/003853
PCT Pub. Date: Jan. 3, 2013

(65) Prior Publication Data
US 2014/0137582 A1    May 22, 2014

Related U.S. Application Data

(60) Provisional application No. 61/502,935, filed on Jun. 30, 2011.

(51) Int. Cl.
| H05K 7/20 | (2006.01) |
| F25B 25/00 | (2006.01) |
| F25B 49/02 | (2006.01) |

(52) U.S. Cl.
CPC ....... *H05K 7/20309* (2013.01); *F25B 25/005* (2013.01); *F25B 49/02* (2013.01);
(Continued)

(58) Field of Classification Search
CPC ........ B60H 2001/00928; F25B 25/005; H05K 7/20218; H05K 7/2029; H05K 7/2079; H05K 7/20827
See application file for complete search history.

(56) References Cited

U.S. PATENT DOCUMENTS

| 4,474,022 A | 10/1984 | Puskar |
| 5,862,675 A | 1/1999 | Scaringe et al. |

(Continued)

FOREIGN PATENT DOCUMENTS

| EP | 1826510 | 2/2007 |
| EP | 2148155 | 1/2010 |

(Continued)

OTHER PUBLICATIONS

International Search Report for corresponding patent application No. PCT/US2012/45301 dated Jul. 2, 2012.
(Continued)

*Primary Examiner* — Jianying Atkisson
*Assistant Examiner* — Antonio R Febles
(74) *Attorney, Agent, or Firm* — Renner, Otto, Boisselle & Sklar, LLP

(57) ABSTRACT

Provided is a cooling system wherein a first two-phase refrigerant can be circulated by a pump through an evaporator, to a first condenser, to a refrigerant-to-refrigerant heat exchanger and back to the pump. By providing the refrigerant-to-refrigerant heat exchanger in series with the condenser, a first environment can be cooled without having to operate a vapor compression circuit when an ambient temperature outside the first environment is a predetermined amount below an ambient temperature in the first environment.

13 Claims, 5 Drawing Sheets

(52) U.S. Cl.
CPC .... *H05K 7/20318* (2013.01); *F25B 2600/111* (2013.01); *Y02B 30/743* (2013.01)

(56) References Cited

U.S. PATENT DOCUMENTS

| | | | |
|---|---|---|---|
| 6,519,955 B2* | 2/2003 | Marsala | 62/119 |
| 6,631,624 B1 | 10/2003 | Kirol et al. | |
| 7,165,412 B1* | 1/2007 | Bean, Jr. | 62/259.2 |
| 7,921,655 B2 | 4/2011 | Wyatt et al. | |
| 7,963,119 B2* | 6/2011 | Campbell et al. | 62/259.2 |
| 2003/0188538 A1 | 10/2003 | Chu et al. | |
| 2007/0283716 A1* | 12/2007 | Marsala | 62/506 |
| 2012/0125023 A1* | 5/2012 | Kopko | F25B 25/005 62/113 |
| 2012/0227429 A1* | 9/2012 | Louvar et al. | 62/196.1 |
| 2012/0297807 A1* | 11/2012 | Canney et al. | 62/228.4 |

FOREIGN PATENT DOCUMENTS

| | | |
|---|---|---|
| JP | 5256478 | 6/2010 |
| WO | 2010079217 | 7/2010 |
| WO | 2010138664 | 12/2010 |
| WO | 2011014784 | 2/2011 |

OTHER PUBLICATIONS

Written Opinion of the International Searching Authority for corresponding patent application No. PCT/US2012/45301 dated Jul. 2, 2012.

\* cited by examiner

PUMPED LIQUID COOLING SYSTEM USING A PHASE CHANGE FLUID WITH ADDITIONAL SUBAMBIENT COOLING

RELATED APPLICATIONS

This application is a national phase of International Application No. PCT/US2012/045301 filed Jul. 2, 2012 and published in the English language, which claims the benefit of U.S. Provisional Application No. 61/502,935 filed Jun. 30, 2011, which is hereby incorporated herein by reference.

FIELD OF INVENTION

The present invention relates generally to liquid cooling systems, and more particularly to pumped liquid cooling systems using a phase change fluid with additional subambient cooling.

BACKGROUND

Power electronic devices, such as IGBTs, SCRs, etc., can achieve high power switching capacity in a small envelope. However, the power electronic devices generate heat during operation, and therefore a cooling system is used to cool the power electronic devices. For example, air may be blown over the power electronic devices or a water-based fluid may be circulated through a cold plate coupled to the power electronic devices to cool the devices.

SUMMARY OF INVENTION

The present invention provides a cooling system wherein a first two-phase refrigerant can be circulated by a pump through an evaporator, to a first condenser, to a refrigerant-to-refrigerant heat exchanger and back to the pump. By providing the refrigerant-to-refrigerant heat exchanger in series with the condenser, a first environment can be cooled without having to operate a vapor compression circuit when an ambient temperature outside the first environment is below an ambient temperature in the first environment.

According to one aspect of the invention, a cooling system is provided that includes a pumped loop cooling circuit including at least one pump and at least one evaporator located in a first environment having a first ambient temperature, and a first condenser located in a second environment having a second ambient temperature, a vapor compression circuit including an expansion valve, a second condenser, and a compressor, the vapor compression circuit located in the second environment, and a refrigerant-to-refrigerant heat exchanger having first and second flow passages in heat exchange relationship, the first flow passage forming part of the pump loop cooling circuit and the second flow passage forming part of the vapor compression circuit and serving as an evaporator in the vapor compression circuit, whereby a first two-phase refrigerant can be circulated by the pump through the evaporator, to the first condenser, to the refrigerant-to-refrigerant heat exchanger and back to the pump, and a second two-phase refrigerant can be circulated through the compressor, the second condenser, the expansion valve, and the refrigerant-to-refrigerant heat exchanger.

In an embodiment, the refrigerant-to-refrigerant heat exchanger is in series with the first condenser.

In another embodiment, the refrigerant-to-refrigerant heat exchanger is downstream of the first condenser and upstream of the one or more evaporators.

In yet another embodiment, when the second ambient temperature is lower than the first ambient temperature, the first environment is cooled without heat transfer taking place in the refrigerant-to-refrigerant heat exchanger, and when the second ambient temperature is approximately equal to or higher than the first ambient temperature, the first environment is cooled via the refrigerant-to-refrigerant heat exchanger.

In still another embodiment, when the second ambient temperature is lower than the first ambient temperature, refrigerant flows from the at least one pump to the at least one evaporator that absorbs heat in the first environment, from the at least one evaporator to the first condenser where the refrigerant is condensed and cooled via a fan blowing air across the condenser, and from the condenser through the first flow passage of the refrigerant-to-refrigerant heat exchanger where heat transfer does not take place.

In a further embodiment, when the second ambient temperature is equal to or higher than the first ambient temperature, refrigerant enters the compressor in a vapor state and is compressed in the compressor, flows from the compressor to the second condenser where the refrigerant is condensed and cooled via a fan blowing air across the condenser, flows from the second condenser to the expansion valve, flows from the expansion valve through the second flow passage of the refrigerant-to-refrigerant heat exchanger where heat transfer occurs, and flows from the refrigerant-to-refrigerant heat exchanger back to the compressor.

In another embodiment, the refrigerant in the second flow passage of the refrigerant-to-refrigerant heat exchanger absorbs heat from the refrigerant in the first flow passage.

In still another embodiment, the pumped loop cooling circuit further includes a liquid receiver configured to receive fluid from the refrigerant-to-refrigerant heat exchanger and to deliver the fluid to the at least one pump.

In yet another embodiment, the liquid receiver is configured to act as a storage tank to compensate for varying volumes of refrigerant in the cooling system.

In a further embodiment, the first environment is an interior of a container.

In another embodiment, the cooling system further includes a first fan for blowing air across the first condenser and a second fan for blowing air across the second condenser.

In still another embodiment, the cooling system further includes a first fan enclosure and a second fan enclosure.

In yet another embodiment, the first condenser and the second condenser have a common fan and fan enclosure.

In a further embodiment, the cooling system further includes a controller for controlling operation of the vapor compression circuit based on temperature within the first and/or second environment.

In another embodiment, the cooling system further includes at least one sensor located in the first environment and configured to sense ambient air temperature in the first environment.

In still another embodiment, the cooling system further includes at least one sensor located in the second environment configured to sense ambient air temperature in the second environment.

In yet another embodiment, the second ambient temperature is approximately equal to or higher than the first ambient temperature, the controller activates the compressor to cool the first environment using the refrigerant-to-refrigerant heat exchanger.

In a further embodiment, when the second ambient temperature is lower than the first ambient temperature, the controller deactivates the compressor and the first environment is cooled without heat transfer taking place in the refrigerant-to-refrigerant heat exchanger.

In another embodiment, where the at least one pump and at least one evaporator includes at least two pumps and at least two evaporators.

In yet another embodiment, the cooling system further includes a liquid receiver disposed between the second condenser and the expansion valve.

In still another embodiment, when the second ambient temperature is higher than the first ambient temperature, the refrigerant-to-refrigerant heat exchanger acts as a condenser in the pumped loop cooling circuit.

In a further embodiment, the cooling system is in combination with a heat-generating component, and wherein the evaporator is configured to cool the heat-generating component disposed in the first environment.

In another embodiment, the heat-generating component is in contact with evaporator.

According to another aspect of the invention, a method of cooling a heat-generating component is provided. The method includes, when a second ambient temperature is lower than a first ambient temperature, pumping refrigerant from at least one pump to at least one evaporator, absorbing heat from the heat-generating component, directing the refrigerant from the evaporator to a first condenser, rejecting heat in the refrigerant to an environment surrounding the first condenser, and directing the refrigerant from the first condenser through a first flow passage of a refrigerant-to-refrigerant heat exchanger where no heat transfer takes place.

In an embodiment, the method further includes directing the refrigerant through the refrigerant-to-refrigerant heat exchanger to a liquid receiver, and directing the refrigerant from the liquid receiver to the at least one pump.

In still another embodiment, the method further includes, when the second ambient temperature is approximately equal to or higher than the first ambient temperature, compressing a refrigerant in a compressor, directing the compressed refrigerant from the compressor to a second condenser where the refrigerant is condensed, rejecting heat in the refrigerant to the environment surrounding the condenser, directing the refrigerant to an expansion valve, expanding the refrigerant in the expansion valve, and directing the refrigerant from the expansion valve to a second flow passage of the refrigerant-to-refrigerant heat exchanger where heat transfer occurs.

In yet another embodiment, the method further includes directing the refrigerant from the second flow passage of the refrigerant-to-refrigerant heat exchanger to the compressor.

In a further embodiment, the refrigerant in the second flow passage of the refrigerant-to-refrigerant heat exchanger absorbs heat from the refrigerant in the first flow passage.

In another embodiment, when heat is rejected from the second condenser, heat is not rejected from the refrigerant flowing through the first condenser.

According to another aspect of the invention, a cooling system is provided having a pumped loop cooling circuit including at least one pump located in a first environment having a first ambient temperature, and a first condenser located in a second environment having a second ambient temperature, a vapor compression circuit including an expansion valve, a second condenser, and a compressor, the vapor compression circuit located in the second environment, and a refrigerant-to-refrigerant heat exchanger having first and second flow passages in heat exchange relationship, the first flow passage forming part of the pump loop cooling circuit and the second flow passage forming part of the vapor compression circuit and serving as an evaporator in the vapor compression circuit, whereby a first two-phase refrigerant can be circulated by the pump to the first condenser, to the refrigerant-to-refrigerant heat exchanger and back to the pump, and a second two-phase refrigerant can be circulated through the compressor, the second condenser, the expansion valve, and the refrigerant-to-refrigerant heat exchanger.

In an embodiment, the pumped liquid cooling circuit further includes at least one evaporator located in the first environment, the at least one evaporator being downstream of the at least one pump and upstream of the first condenser.

The foregoing and other features of the invention are hereinafter described in greater detail with reference to the accompanying drawings.

DETAILED DESCRIPTION

Figure 1:
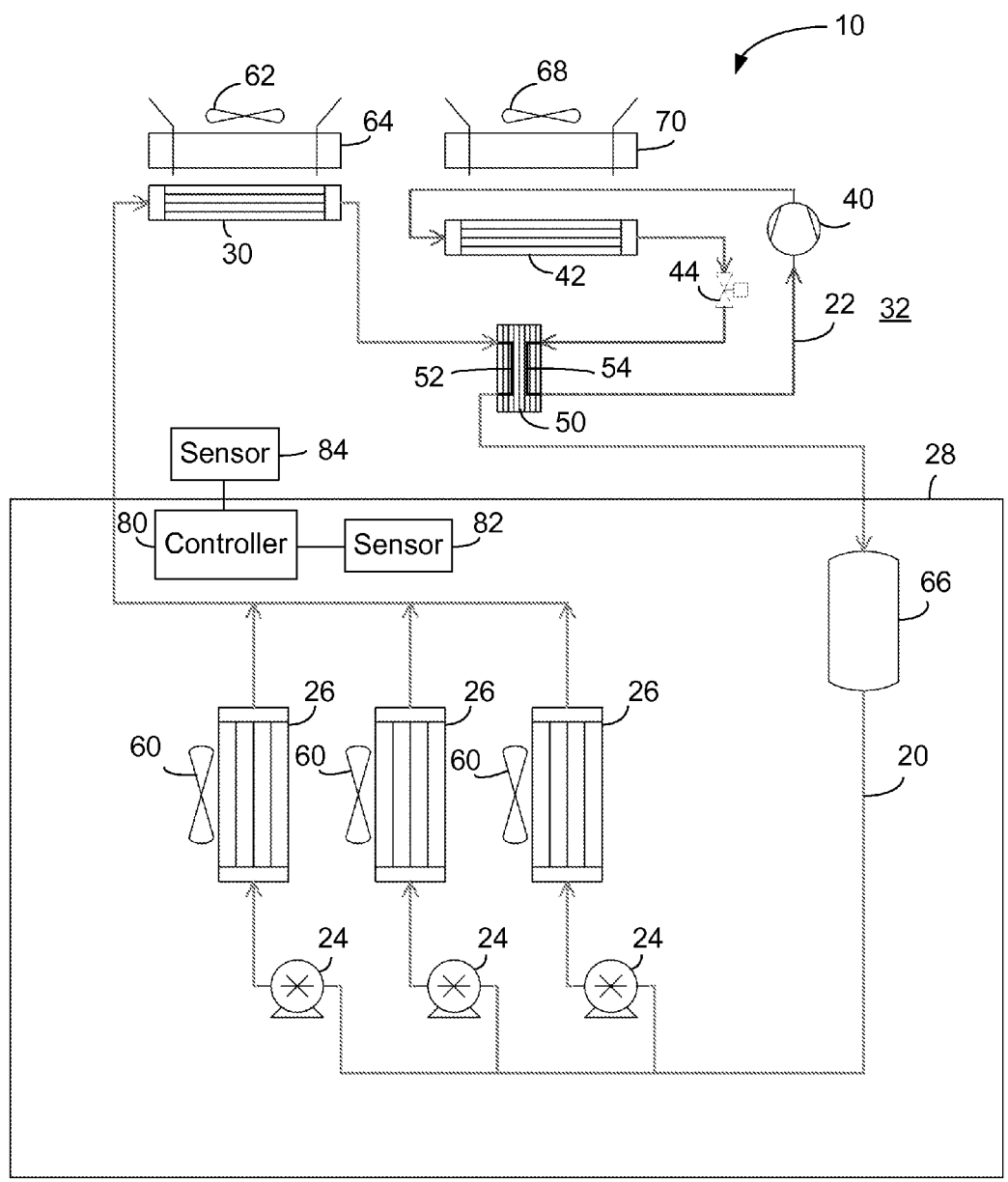
FIG. 1 is a schematic view of an exemplary cooling system according to the invention.

Turning now in detail to the drawings and initially to FIG. 1, a schematic representation of a cooling system is illustrated generally at 10. The cooling system includes a pumped loop cooling circuit 20 and a vapor compression circuit 22. The pumped loop cooling circuit 20 includes at least one pump 24 and at least one evaporator 26 located in a first environment 28 having a first ambient temperature, which first environment may be an interior of a container, and a first condenser 30 located in a second environment 32 having a second ambient temperature. The cooling system 10 may include any suitable number of pumps and evaporators, such as three pumps and evaporators arranged in parallel to one another as shown. The vapor compression circuit, which is located in the second environment 32, includes a compressor 40, a second condenser 42, and an expansion valve 44.

The cooling system 10 also includes a refrigerant-to-refrigerant heat exchanger 50 having first and second flow passages 52 and 54 in heat exchange relationship with one another. The first flow passage 52 forms part of the pumped loop cooling circuit 20 and the second flow passage 54 forms part of the vapor compression circuit 22 and serves as an evaporator in the vapor compression circuit. A first two-phase fluid, such as a two-phase refrigerant, can be circulated through the pumped loop cooling circuit 20 and a second two-phase fluid, such as a two-phase refrigerant, can be circulated through the vapor compression circuit. The first refrigerant can be circulated by the pump 24 through the evaporator 26, to the first condenser 30 and to the refrigerant-to-refrigerant heat exchanger 50, which is in series with the first condenser. The second refrigerant, can be circulated through the compressor 40, the second condenser 42, the expansion valve 44, and to the refrigerant-to-refrigerant heat exchanger 50.

The pumped loop cooling circuit 22 also includes at least one fan 60 associated with each evaporator 24, at least one fan 62 and fan enclosure 64 associated with the condenser 30, and a liquid receiver 66. The vapor compression circuit also includes at least one fan 68 and fan enclosure 70 associated with the condenser 42. The at least one fan 60 assists the evaporator 30 in the absorption of heat from inside the first environment 28 by blowing air over the evaporator. The at least one fan 62 and fan enclosure 64 are provided to cool the two-phase refrigerant flowing through the condenser 30 when the vapor compression circuit is deactivated, by blowing air across the condenser 30. The liquid receiver 66 receives fluid from the refrigerant-to-refrigerant heat exchanger 50 and delivers the fluid to the at least one pump 24. The liquid receiver 66 may act as a storage tank to compensate for varying volumes of the fluid in the system. Similar to the fan 62 and fan enclosure 64, the fan 68 and fan enclosure 70 are provided to cool the two-phase refrigerant flowing through the condenser 42 when the vapor compression circuit is activated, by blowing air across the condenser 42.

In operation, when the ambient temperature of the second environment 32 is lower than a maximum allowable ambient temperature in the first environment, for example below about 20° Celsius, the pumped loop cooling circuit 20 is activated and the vapor compression circuit is deactivated. During operation, refrigerant flows in a liquid state from the at least one pump 24 to the at least one evaporator 26, which absorbs heat in the first environment 28 with the assistance of the fan 60, and the refrigerant starts to boil and becomes a liquid-vapor when it absorbs the heat. The liquid-vapor then flows out of the evaporator 26 to the second environment 32 and into to the first condenser 30, where the refrigerant is cooled via the fan 62 blowing air across the condenser 30, thereby rejecting the heat to the second environment. The condenser 30 also condenses the refrigerant to a liquid state. The refrigerant then flows through the first flow passage 52 of the refrigerant-to-refrigerant heat exchanger 50, where no heat transfer takes place, and then to the liquid receiver 66. From the liquid receiver the refrigerant, in the liquid form, returns to the at least one pump 24.

When the vapor compression circuit 22 is not operating, the first environment 28 is cooled without operating the compressor 40, thereby reducing energy usage by the cooling system 10. Additionally, as noted above, heat transfer does not take place in the refrigerant-to-refrigerant heat exchanger 50, therefore the two-phase refrigerant in the pumped loop cooling circuit is not heated as it flows through the refrigerant-to-refrigerant heat exchanger 50. By fluidically connecting the first condenser 30 in series with the refrigerant-to-refrigerant heat exchanger 50, control valves are not used to rout the refrigerant to the condenser 30 when the ambient temperature of the second environment 32 is lower than a maximum ambient temperature in the first environment 28. Additionally, by fluidically connecting the first condenser 30 in series with the refrigerant-to-refrigerant heat exchanger 50, control valves are not used to rout the refrigerant to the heat exchanger 50 when the ambient temperature of the second environment 32 is equal to or higher than the maximum ambient temperature in the first environment 28. The series arrangement also prevents refrigerant from being trapped in refrigerant lines in a parallel arrangement that are not used depending on the ambient temperature of the second environment 32, which reduces the need for extra refrigerant stored in the liquid receiver 66.

When the ambient temperature of the second environment 32 is approximately equal to or higher than the maximum allowable ambient temperature in the first environment 28, the pumped loop cooling circuit 20 and the vapor compression circuit 22 are activated. During operation, refrigerant in the vapor compression circuit 22 is enters the compressor 40 in a vapor state and is compressed in the compressor 40. The vapor then flows to the second condenser 42 where the refrigerant is cooled via the fan 68 blowing air across the condenser 42, thereby rejecting heat to the second environment. The condenser 42 also condenses the refrigerant to a liquid state. The liquid then flows to the expansion valve 44 where the fluid is expanded to a low pressure liquid-vapor. The liquid-vapor then flows from the expansion valve 44 to the second flow passage 54 of the refrigerant-to-refrigerant heat exchanger 50, which serves as an evaporator, and heat is rejected from the first flow passage 52 to the refrigerant flowing through the second flow passage 54. The refrigerant then flows from the second flow passage of the refrigerant-to-refrigerant heat exchanger 50 back to the compressor 40 in the vapor state.

During operation of the vapor compression circuit 22, the at least one pump 24 directs the refrigerant to the at least one evaporator 26, which absorbs heat in the first environment 28 with the assistance of the fan 60. The refrigerant then flows out of the evaporator 26 to the second environment and into to the first condenser 30, where no heat transfer occurs. The refrigerant then flows through the first flow passage 52 of the refrigerant-to-refrigerant heat exchanger 50, which serves as a condenser, and heat is rejected from the first flow passage 52 to the refrigerant flowing through the second flow passage 54 and the refrigerant in the first flow passage is condensed to a liquid. The cooled refrigerant then flows in the liquid form from the first flow passage 52 of the refrigerant-to-refrigerant heat exchanger 50 to the liquid receiver.

As noted above, when the ambient temperature of the second environment 32 is lower than the maximum allowable ambient temperature in the first environment 28, the first environment is cooled to below the maximum allowable ambient temperature by the pumped loop cooling circuit 20, which provides an efficient system due to low power consumption of the pump. When the ambient temperature of the second environment 32 is approximately equal to or higher than the maximum allowable ambient temperature in the first environment 28, the vapor compression circuit 22 is activated to cool the first environment 28 below the maximum allowable ambient temperature.

To control operation of the cooling system 10, the system includes a controller 80, which controls which circuit is active based on the temperature within the first environment 28 and optionally the ambient temperature of the second environment 32 to determine when to activate the vapor compression circuit 22. The cooling system may also include at least one sensor 82 located in the first environment 28 that is configured to sense ambient air temperature in the first environment and at least one sensor 84 located in the second environment 32 that is configured to sense ambient air temperature in the second environment. The sensors are coupled to the controller 80 in any suitable manner.

When the second ambient temperature is approximately equal to or higher than the first ambient temperature, the controller 80 activates the compressor 40 to cool the first environment 28 using the refrigerant-to-refrigerant heat exchanger 50. When the second ambient temperature is lower than the first ambient temperature, the controller 80 deactivates the compressor 40 and the first condenser 30 is cooled using the first condenser 30 and without heat transfer taking place in the refrigerant-to-refrigerant heat exchanger 50. Additionally, when there is a light heat load on the cooling system 10 and a cold outside ambient temperature, the controller 80 can deactivate the pumped loop cooling circuit 20 and the vapor compression circuit 22. Moreover, on initial start-up in cold ambient environments, the controller 80 can activate the vapor compression circuit 22 to act as a heat pump loop to initially heat the ambient air in the first environment 28. When acting as a heat pump loop, the vapor compression circuit 22 runs in reverse to reject heat from the second flow passage 52 to the refrigerant in the first flow passage to heat the first environment 28. Further, the controller 80 can activate the vapor compression circuit 22 when sub-ambient cooling is needed.

Figure 2:
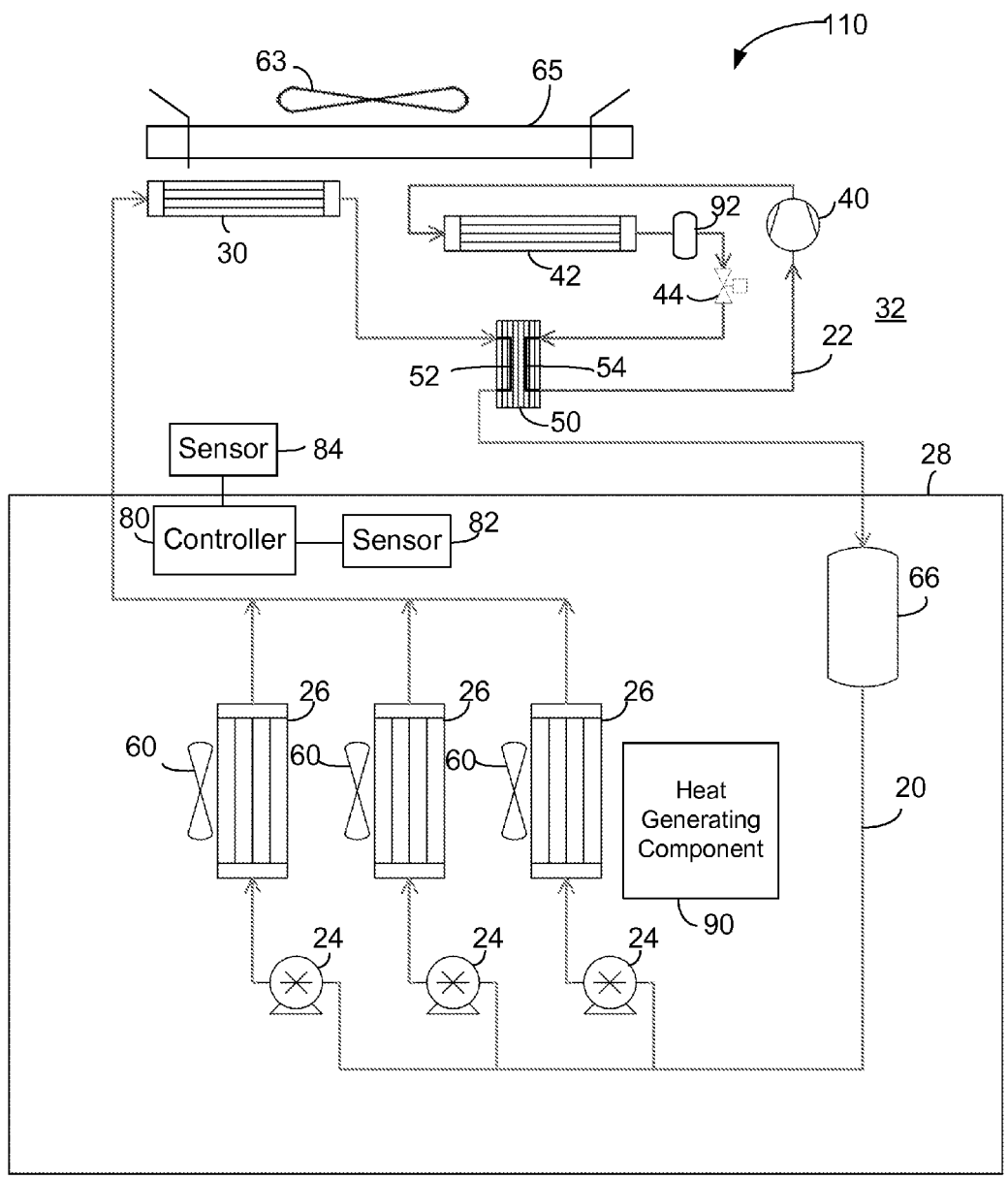
FIG. 2 is a schematic view of another exemplary cooling system according to the invention.

Turning now to FIG. 2, another exemplary embodiment of cooling system is shown at 110. The cooling system 110 is substantially the same as the above-referenced cooling system 10, and consequently the same reference numerals are used to denote structures corresponding to similar structures in the cooling system. In addition, the foregoing description of the cooling system 10 is equally applicable to the cooling system 110 except as noted below.

The cooling system 110 is provided for cooling a heat-generating component 90 in the first environment 28. The heat-generating component may be any suitable heat-generating component needing cooled, for example power electronics, such as IGBTs, SCRs, etc., housed indoors or within a container. The heat-generating component 90 may be positioned near the at least one evaporator 26 or be in contact with the at least one evaporator, and the at least one evaporator is configured to cool the heat-generating component.

The cooling system 110 additionally includes a single fan 63 and fan enclosure 65 provided to blow air across the condensers 30 and 42. Only one fan is used because only one condenser operates at a time, i.e. when the vapor compression circuit 22 is deactivated the condenser 42 is not activated and when the vapor compression circuit is activated heat transfer does not occur in the condenser 30. In another embodiment, a single condenser may be provided to replace the condenser 30 and the condenser 42. The single condenser would include two flow passages therethrough, one for the pumped loop cooling circuit 20 and one for the vapor compression circuit 22 to prevent the refrigerants from being mixed. The cooling system 110 may also include a second liquid receiver 92 in the vapor compression circuit downstream of the second condenser 42 and upstream of the expansion valve 44.

Figure 3:
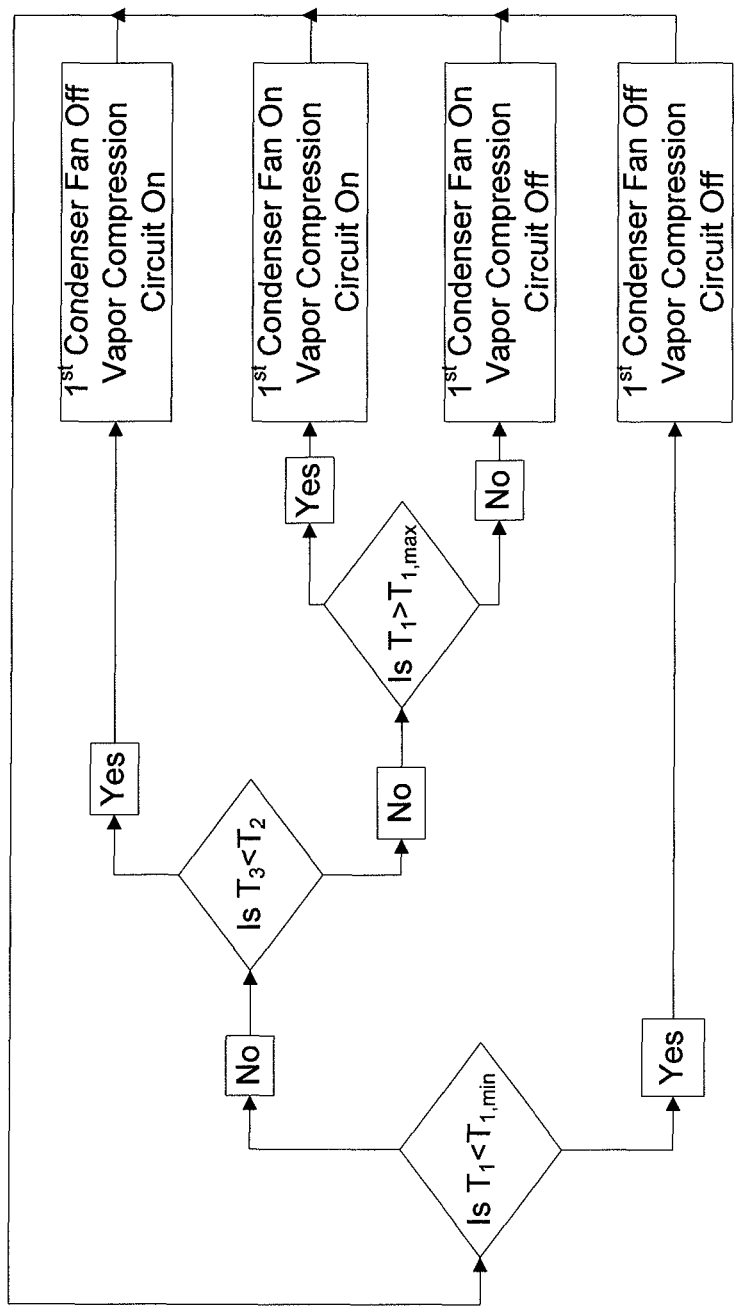
FIG. 3 is an exemplary control process of the cooling system of FIG. 1.

Turning now to FIG. 3, an exemplary control process of the cooling system 10 is illustrated. The process is configured to be controlled by the controller 80 described above. The process begins with a determination of whether the ambient temperature $T_1$ of the first environment 28 is less than a minimum allowable temperature $T_{1, min}$ of the first environment, which may be, for example, about 10° Celsius. If yes, the first fan 62 and the vapor compression circuit 22 are deactivated, and the heat generated in the first environment 28, for example by the heat-generating component, serves to warm the first environment above the minimum temperature.

If no and the ambient temperature $T_1$ is greater than the minimum temperature $T_{1, min}$, then the determination is made whether a temperature $T_3$ of the fluid in the pumped loop cooling circuit 20 is less than a temperature $T_2$ of the second environment 32. If yes, the fan 62 is deactivated and the vapor compression circuit 22 is activated to cool the refrigerant in the pumped liquid cool circuit 20 as described above.

If no and the temperature $T_3$ is greater than the temperature $T_2$, then the determination is made whether the temperature $T_1$ of the first environment 28 is greater than a maximum allowable temperature $T_{1, max}$ of the first environment, which may be, for example, about 20° Celsius. If no and the temperature $T_1$ is less than the maximum temperature $T_{1, max}$, the fan 62 is activated, the vapor compression circuit 22 is deactivated and the refrigerant in the pumped loop cooling circuit 20 is cooled in the condenser 30. If yes and the temperature $T_1$ is greater than the maximum temperature $T_{1, max}$, both the fan 62 and the vapor compression circuit 22 are activated to cool the refrigerant in the pumped loop cooling circuit 20. In this way, the fan 62 at least partially cools the refrigerant in the pumped loop cooling circuit, reducing the amount of cooling by the vapor compression circuit 22.

Figure 4:
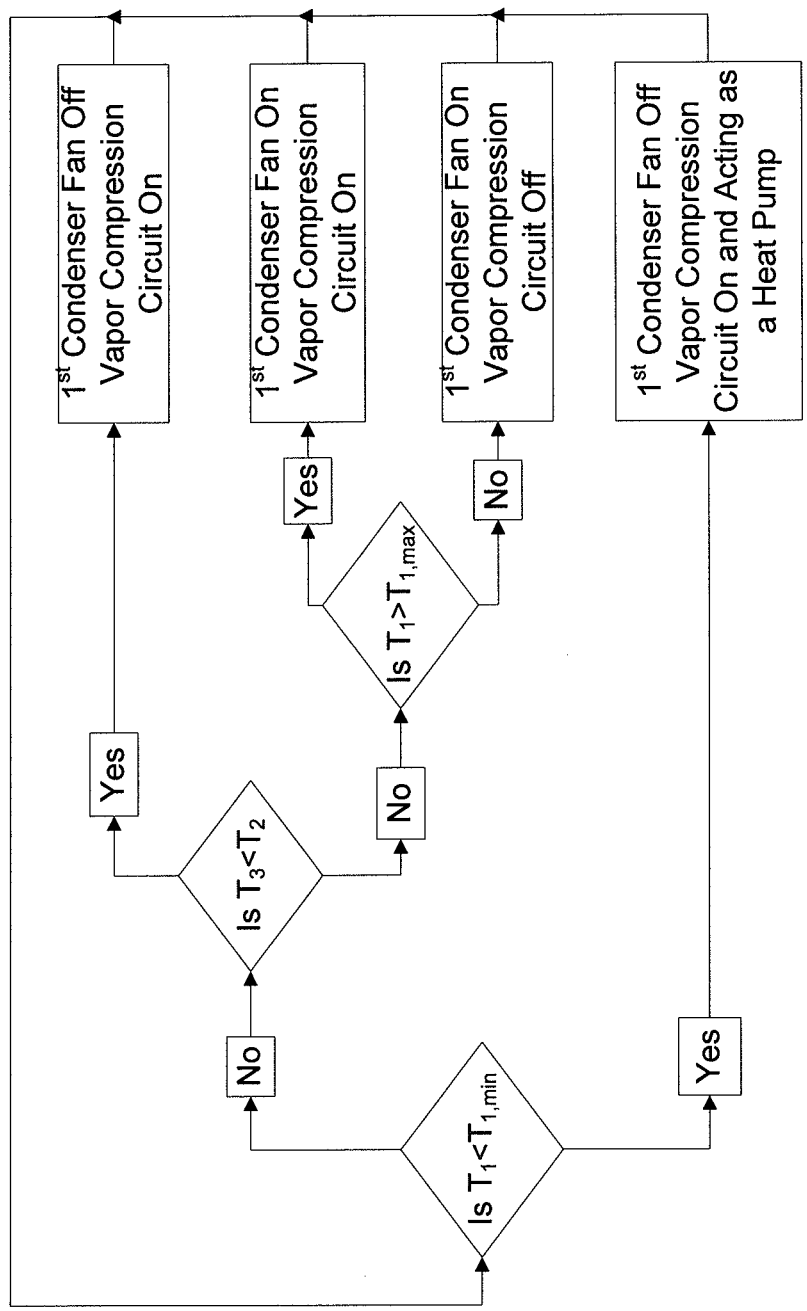
FIG. 4 is another exemplary control process of the cooling system of FIG. 1.

Turning now to FIG. 4, another exemplary control process of the cooling system 10 is illustrated. The control process of FIG. 4 is substantially the same as the above described control process, except optionally, when the ambient temperature $T_1$ of the first environment 28 is less than the minimum temperature $T_{1, min}$ of the first environment, the controller can activate the vapor compression circuit 22 to act as a heat pump loop to initially heat the ambient air in the first environment 28.

Figure 5:
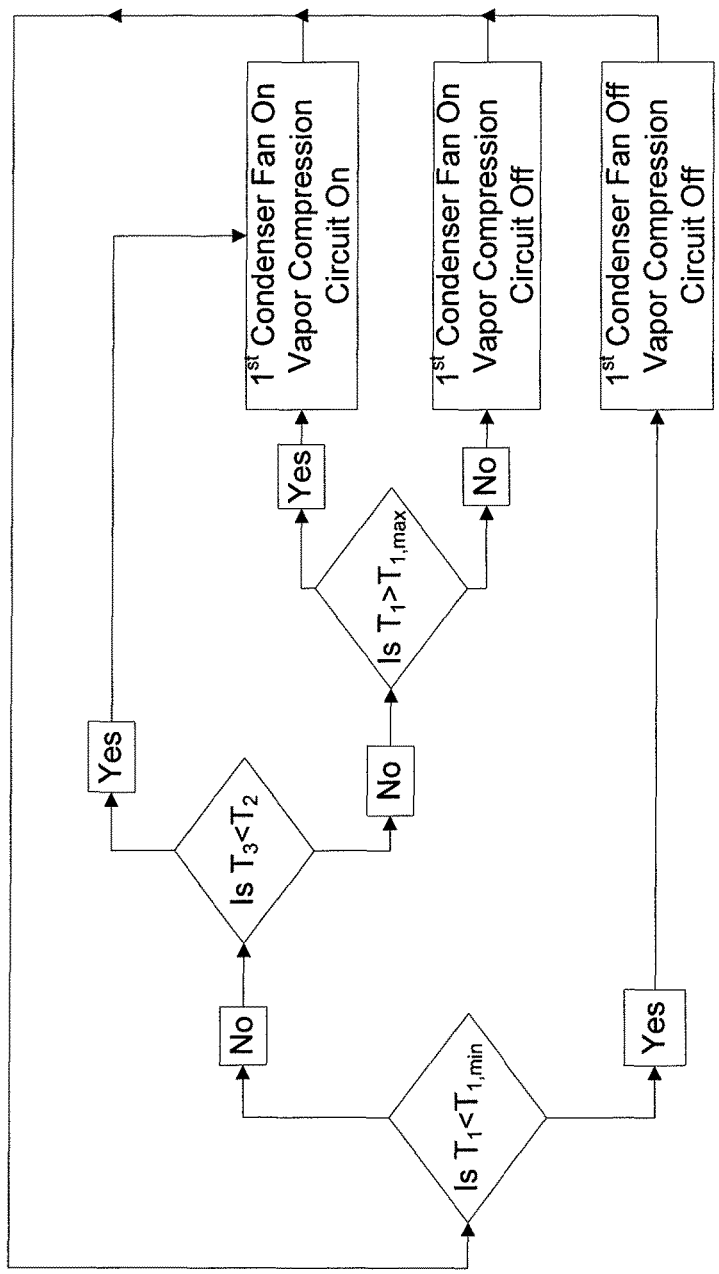
FIG. 5 is an exemplary control process of the cooling system of FIG. 2.

Turning not to FIG. 5, an exemplary control process of the cooling system 110 is illustrated. The control process of FIG. 5 is substantially the same as the control process described in FIG. 3, except when temperature $T_3$ of the fluid in the pumped loop cooling circuit 20 is less than a temperature $T_2$ of the second environment 32, both the fan 65 and the vapor compression circuit 22 are activated due to the system only including one fan 65.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:
1. A cooling system including:
   a pumped loop cooling circuit including at least one pump and at least one evaporator located in a first environment having a first ambient temperature, and a first condenser located in a second environment having a second ambient temperature;

a vapor compression circuit including an expansion valve, a second condenser, and a compressor, the vapor compression circuit located in the second environment; and a refrigerant-to-refrigerant heat exchanger having first and second flow passages in heat exchange relationship, the first flow passage forming part of the pump loop cooling circuit and the second flow passage forming part of the vapor compression circuit and serving as an evaporator in the vapor compression circuit;

wherein, the pumped loop cooling circuit is configured such that, when operating, a first two-phase fluid is circulated from the at least one pump to the at least one evaporator, then to the first condenser, then to the refrigerant-to-refrigerant heat exchanger, and then back to the at least one pump;

wherein, the vapor compression circuit is configured such that, when operating, a second two-phase fluid is circulated from the compressor to the second condenser, then to the expansion valve, then to the refrigerant-to-refrigerant heat exchanger, and then back to the compressor; and wherein, the cooling system further includes a controller configured to enable or disable operation of the vapor compression circuit, and configured to enable or disable cooling of the first two-phase fluid via the first condenser, such that:

(i) based upon a determination that a temperature of the first two-phase fluid in the pumped loop cooling circuit is greater than the second ambient temperature, and the temperature of the first ambient temperature is greater than a maximum threshold temperature of the first environment, the controller is configured to enable cooling of the first two-phase fluid via the first condenser, and is configured to enable operation of the vapor compression circuit to cool the first environment via heat transfer taking place in the refrigerant-to-refrigerant heat exchanger; or (ii) based upon a determination that a temperature of the first two-phase fluid in the pumped loop cooling circuit is greater than the second ambient temperature, and the temperature of the first ambient temperature is less than the maximum threshold temperature of the first environment, the controller is configured to enable cooling of the first two-phase fluid via the first condenser, and is configured to disable operation of the vapor compression circuit such that the first environment is cooled without heat transfer taking place in the refrigerant-to-refrigerant heat exchanger.

2. The cooling system according to claim 1, wherein the refrigerant-to-refrigerant heat exchanger is in series with the first condenser.

3. The cooling system according to claim 1, wherein the refrigerant-to-refrigerant heat exchanger is downstream of the first condenser and upstream of the at least one evaporator.

4. The cooling system according to claim 1, wherein the pumped loop cooling circuit further includes a liquid receiver configured to receive fluid from the refrigerant-to-refrigerant heat exchanger and to deliver the fluid to the at least one pump.

5. The cooling system according to claim 4, wherein the liquid receiver is configured to act as a storage tank to compensate for varying volumes of two-phase fluid in the cooling system.

6. The cooling system according to claim 1, further including a first fan for blowing air across the first condenser and a second fan for blowing air across the second condenser.

7. The cooling system according to claim 1, wherein:

(iii) based upon a determination that the temperature of the first two-phase fluid in the pumped loop cooling circuit is less than the second ambient temperature, the controller is configured to disable cooling of the first two-phase fluid via the first condenser, and is configured to enable operation of the vapor compression circuit to cool the first environment by heat transfer taking place in the refrigerant-to-refrigerant heat exchanger; or (iv) based upon a determination that the temperature of the first two-phase fluid in the pumped loop cooling circuit is less than the second ambient temperature, the controller is configured to enable cooling of the first two-phase fluid via the first condenser, and is configured to enable operation of the vapor compression circuit to cool the first environment by heat transfer taking place in the refrigerant-to-refrigerant heat exchanger.

8. The cooling system according to claim 1, wherein:

(v) based upon a determination that the first ambient temperature is less than a minimum threshold temperature of the first environment, the controller is configured to disable cooling of the first two-phase fluid via the first condenser, and is configured to disable operation of the vapor compression circuit such that no heat transfer takes place in the refrigerant-to-refrigerant heat exchanger; or (vi) based upon a determination that the first ambient temperature is less than a minimum threshold temperature of the first environment, the controller is configured to disable cooling of the first two-phase fluid via the first condenser, and is configured to enable operation of the vapor compression circuit as a heat pump to heat the first environment.

9. The cooling system according to claim 1, wherein, when the controller enables cooling of the first two-phase fluid via the first condenser, the controller activates a fan to blow air across the first condenser.

10. The cooling system according to claim 1, wherein, when the controller enables operation of the vapor compression circuit to cool the first environment via heat transfer taking place in the refrigerant-to-refrigerant heat exchanger, the two-phase fluid in the second flow passage of the refrigerant-to-refrigerant heat exchanger absorbs heat from the two-phase fluid in the first flow passage of the refrigerant-to-refrigerant heat exchanger.

11. A cooling system including:

a pumped loop cooling circuit including at least one pump and at least one evaporator located in a first environment having a first ambient temperature, and a first condenser located in a second environment having a second ambient temperature;

a vapor compression circuit including an expansion valve, a second condenser, and a compressor, the vapor compression circuit located in the second environment; and a refrigerant-to-refrigerant heat exchanger having first and second flow passages in heat exchange relationship, the first flow passage forming part of the pump loop cooling circuit and the second flow passage forming part of the vapor compression circuit and serving as an evaporator in the vapor compression circuit;

wherein, the pumped loop cooling circuit is configured such that, when operating, a first two-phase fluid is circulated from the at least one pump to the at least one evaporator, then to the first condenser, then to the refrigerant-to-refrigerant heat exchanger, and then back to the at least one pump;

wherein, the vapor compression circuit is configured such that, when operating, a second two-phase fluid is circulated from the compressor to the second condenser, then to the expansion valve, then to the refrigerant-to-refrigerant heat exchanger, and then back to the compressor; and wherein, the cooling system further includes a controller configured to enable or disable operation of the vapor compression circuit, and configured to enable or disable cooling of the first two-phase fluid via the first condenser, such that:

(i) based upon a determination that the first ambient temperature is greater than the minimum threshold temperature of the first environment, and the temperature of the first two-phase fluid in the pumped loop cooling circuit is greater than the second ambient temperature, and the temperature of the first ambient temperature is greater than the maximum threshold temperature of the first environment, the controller is configured to enable cooling of the first two-phase fluid via the first condenser, and is configured to enable operation of the vapor compression circuit to cool the first environment by heat transfer taking place in the refrigerant-to-refrigerant heat exchanger; or (ii) based upon a determination that the first ambient temperature is greater than the minimum threshold temperature of the first environment, and the temperature of the first two-phase fluid in the pumped loop cooling circuit is greater than the second ambient temperature, and the temperature of the first ambient temperature is less than the maximum threshold temperature of the first environment, the controller is configured to enable cooling of the first two-phase fluid via the first condenser, and is configured to disable operation of the vapor compression circuit such that the first environment is cooled without heat transfer taking place in the refrigerant-to-refrigerant heat exchanger; or (iii) based upon a determination that the first ambient temperature is greater than the minimum threshold temperature of the first environment, and the temperature of the first two-phase fluid in the pumped loop cooling circuit is less than the second ambient temperature, the controller is configured to disable cooling of the first two-phase fluid via the first condenser, and is configured to enable operation of the vapor compression circuit to cool the first environment by heat transfer taking place in the refrigerant-to-refrigerant heat exchanger; or (iv) based upon a determination that the first ambient temperature is greater than the minimum threshold temperature of the first environment, and the temperature of the first two-phase fluid in the pumped loop cooling circuit is less than the second ambient temperature, the controller is configured to enable cooling of the first two-phase fluid via the first condenser, and is configured to enable operation of the vapor compression circuit to cool the first environment by heat transfer taking place in the refrigerant-to-refrigerant heat exchanger; or (v) based upon a determination that the first ambient temperature is less than a minimum threshold temperature of the first environment, the controller is configured to disable cooling of the first two-phase fluid via the first condenser, and is configured to disable operation of the vapor compression circuit such that no heat transfer takes place in the refrigerant-to-refrigerant heat exchanger; or (vi) based upon a determination that the first ambient temperature is less than a minimum threshold temperature of the first environment, the controller is configured to disable cooling of the first two-phase fluid via the first condenser, and is configured to enable operation of the vapor compression circuit as a heat pump to heat the first environment.

12. The cooling system according to claim 11, wherein, when the controller enables cooling of the first two-phase fluid via the first condenser, the controller activates a fan to blow air across the first condenser.

13. The cooling system according to claim 11, wherein, when the controller enables operation of the vapor compression circuit to cool the first environment via heat transfer taking place in the refrigerant-to-refrigerant heat exchanger, the two-phase fluid in the second flow passage of the refrigerant-to-refrigerant heat exchanger absorbs heat from the two-phase fluid in the first flow passage of the refrigerant-to-refrigerant heat exchanger.

* * * * *